(12) United States Patent
Forrest et al.

(10) Patent No.: US 9,929,365 B2
(45) Date of Patent: Mar. 27, 2018

(54) EXCITED STATE MANAGEMENT

(71) Applicants: The Regents of the University of Michigan, Ann Arbor, MI (US); The University of Southern California, Los Angeles, CA (US)

(72) Inventors: Stephen R. Forrest, Ann Arbor, MI (US); Michael Slootsky, Ann Arbor, MI (US); Mark E. Thompson, Anaheim Hills, CA (US)

(73) Assignees: The Regents of the University of Michigan, Ann Arbor, MI (US); The University of Southern California, Los Angeles, CA (US)

( * ) Notice: Subject to any disclaimer, the term of this patent is extended or adjusted under 35 U.S.C. 154(b) by 391 days.

(21) Appl. No.: 14/724,238

(22) Filed: May 28, 2015

(65) Prior Publication Data

US 2015/0349286 A1 Dec. 3, 2015
US 2017/0149008 A9 May 25, 2017

Related U.S. Application Data

(60) Provisional application No. 62/003,591, filed on May 28, 2014, provisional application No. 62/095,904, filed on Dec. 23, 2014, provisional application No. 62/103,483, filed on Jan. 14, 2015, provisional application No. 62/108,100, filed on Jan. 27, 2015.

(51) Int. Cl.
*H01L 51/00* (2006.01)
*H01L 51/50* (2006.01)
*C09K 11/06* (2006.01)

(52) U.S. Cl.
CPC .......... *H01L 51/5028* (2013.01); *C09K 11/06* (2013.01); *H01L 51/5016* (2013.01); *C09K 2211/1011* (2013.01); *C09K 2211/1088* (2013.01)

(58) Field of Classification Search
None
See application file for complete search history.

(56) References Cited

U.S. PATENT DOCUMENTS 4,769,292 A 9/1988 Tang et al.
5,247,190 A 9/1993 Friend et al.
(Continued)

FOREIGN PATENT DOCUMENTS

WO 2008057394 5/2008
WO 2010011390 1/2010

OTHER PUBLICATIONS

Dias et al. "Triplet Harvesting with 100% Efficiency by Way of Thermally Activated Delayed Fluorescence in Charge Transfer OLED Emitters" Adv. Mater. 2013, 25, 3707-3714.*
(Continued)

*Primary Examiner* — Robert S Loewe
(74) *Attorney, Agent, or Firm* — Morris & Kamlay LLP

(57) ABSTRACT

Arrangements and techniques for providing organic emissive layers are provided, in which the emissive layer includes a first dopant having a dissociative energy level. A second dopant in the emissive layer provides a solid state sink energy level, to which doubly excited excitons and/or polarons may transition instead of to the dissociative energy level, thereby decreasing the undesirable effects of transitions to the dissociative energy level.

17 Claims, 5 Drawing Sheets

(56) References Cited

U.S. PATENT DOCUMENTS

| | | | |
|---|---|---|---|
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,274,980 | B1 | 8/2001 | Burrows et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,475,648 | B1* | 11/2002 | Hatwar .................. H01B 1/127 252/301.16 |
| 6,992,437 | B2* | 1/2006 | Lee ....................... C09K 11/06 313/504 |
| 7,279,704 | B2 | 10/2007 | Walters et al. |
| 7,431,968 | B1 | 10/2008 | Shtein et al. |
| 7,608,993 | B2* | 10/2009 | Matsuura ............... C09K 11/06 257/40 |
| 7,846,763 | B2* | 12/2010 | Bold .................... B01J 31/2273 438/99 |
| 7,968,146 | B2 | 6/2011 | Wagner et al. |
| 8,456,081 | B2 | 6/2013 | Zhang et al. |
| 8,692,232 | B2* | 4/2014 | Choi .................. H01L 51/5012 257/40 |
| 2003/0230980 | A1 | 12/2003 | Forrest et al. |
| 2004/0174116 | A1 | 9/2004 | Lu et al. |
| 2005/0046337 | A1* | 3/2005 | Chin .................. H01L 51/5012 313/504 |
| 2008/0290791 | A1* | 11/2008 | Lee .................... H01L 51/5036 313/504 |
| 2009/0044864 | A1* | 2/2009 | Thompson ............. B82Y 10/00 136/263 |
| 2009/0108749 | A1* | 4/2009 | Yokoyama ............. B82Y 10/00 313/504 |
| 2009/0121624 | A1* | 5/2009 | D'Andrade ......... H01L 51/0025 313/504 |
| 2009/0189509 | A1* | 7/2009 | Qiu ..................... H01L 51/0058 313/498 |
| 2009/0278444 | A1* | 11/2009 | Forrest ................ H01L 51/0085 313/504 |
| 2011/0062425 | A1* | 3/2011 | Kishino .............. H01L 51/5016 257/40 |
| 2011/0291082 | A1* | 12/2011 | Terao ..................... H05B 33/14 257/40 |
| 2012/0206035 | A1* | 8/2012 | Shitagaki ............ H01L 51/0072 313/503 |
| 2013/0221332 | A1* | 8/2013 | Xia ..................... H01L 51/0035 257/40 |
| 2013/0277653 | A1* | 10/2013 | Osaka ................. H01L 51/0052 257/40 |
| 2013/0292656 | A1* | 11/2013 | Seo ......................... H05B 33/14 257/40 |
| 2015/0280158 | A1* | 10/2015 | Ogiwara ............. H01L 51/5044 257/40 |

OTHER PUBLICATIONS

Adachi, et al., "Endothermic energy transfer: A mechanism for generating very efficient high-energy phosphorescent emission in organic materials", Appl. Phys. Letters, vol. 79, No. 13, Sep. 24, 2001, 2082.

Baldo, et al., "Highly efficient phosphorescent emission from organic electroluminescent devices", Nature, vol. 395, pp. 151-154, 1998.

Baldo, et al., "Very high-efficiency green organic light-emitting devices based on electrophosphorescence", Applied Physics Letters, vol. 75, No. 1, pp. 4-6, Jul. 5, 1999.

D'Andrade, et al., "Efficient Organic Electrophosphorescent White-Light_Emitting Device with a Triple Doped Emissive Layer", Adv. Mater. 2004, 16, No. 7, Apr. 5, 2004, 624.

Giebink, et al., "Direct evidence for degradation of polaron excited states in organic light emitting diodes", J. Appl. Phys 105, 2009, 124514.

Giebink, et al., "Intrinsic luminance loss in phosphorescent small-molecule organic light emitting devices due to bimolecular annihilation reactions", J. Appl. Phys 103, 2008, 044509.

Kanno, et al., "White Stacked Electrophosphorescent Organic Light-Emitting Devices Employing MoO3 as a Charge-Generation Layer", Adv. Mater. 2006, 18, 2006, 339-342.

Levermore, et al., "Phosphorescent organic light-emitting diodes for high-efficacy long-lifetime solid-state lighting", J. Photonics for Energy 2, 2012, Feb. 12, 2005.

Shen, et al., "Three-Color, Tunable, Organic Light-Emitting Devices", Science 276, 1997, 2009.

Wang, et al., "Photodegradation of small-molecule organic photovoltaics", Solar Energy Materials & Solar Cells 125, 2014, 170-175.

Zhang, et al., "Tenfold increase in the lifetime of blue phosphorescent organic light-emitting diodes", Nature Commun. 5, 2014, 5008.

* cited by examiner postions 1-8:
$(CH)_{8-p}(N)_p$
$p = 0, 1, 2$

EXCITED STATE MANAGEMENT

CROSS-REFERENCE TO RELATED APPLICATIONS

This application claims priority to U.S. Provisional Patent Application Nos. 62/003,591, filed May 28, 2014; 62/095,904, filed Dec. 23, 2014; 62/103,483, filed Jan. 14, 2015; and 62/108,100, filed Jan. 27, 2015, the entire contents of each of which is incorporated herein by reference.

STATEMENT REGARDING GOVERNMENT RIGHTS

This invention was made with government support under Contract No. DOE DE-SC00001013 awarded by the Department of Energy, and under FA9550-14-1-0245 awarded by the U.S. Air Force Office of Scientific Research. The government has certain rights in the invention.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs) and, more specifically, to arrangements and techniques that provide relatively high performance and lifetime to various types and components of OLEDs, and devices such as organic light emitting diodes and other devices, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)3, which has the following structure:

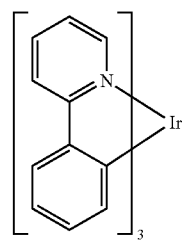

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

According to an embodiment, an organic emissive layer is provided that includes a host material, a first dopant having a dissociative first energy level at which doubly excited excitons and/or polarons undergo a dissociative reaction, and a second dopant having a solid state sink energy level that between a singly-excited energy level of the first dopant and a multiply-excited energy level of the first dopant. Alternatively or in addition, the solid state sink energy level may be lower than the dissociative energy level. The multiply-excited state may be, for example, a doubly-excited triplet energy level or a doubly-excited polaron energy level of the first dopant. The solid state sink energy level may be at least 0.2 eV lower than the multiply-excited state of the first dopant. The rate of transition of the excitons and/or polarons from a doubly-excited triplet energy level of the first dopant to the solid state sink energy level of the second dopant may be higher than the rate of transition from the double-excited triplet energy level of the first dopant to the dissociative energy level. The first dopant may have an emissive first triplet energy level that is lower than the solid state sink energy level of the second dopant. The concentration of the first dopant may be graded within the host material. The first dopant may be a thermally assisted delayed fluorescence dopant. The second dopant may comprise a material that absorbs light in the ultraviolet region of the electromagnetic spectrum, such as NTCDA. The first dopant may include a phosphorescent dopant or a fluorescent dopant. The dopant may provide thermally assisted delayed fluorescence in the emissive layer.

In an embodiment, a device is provided that includes an emissive layer as previously described. The device may include an OLED, such as a white-emitting OLED (WOLED). The emissive layer may emit any color of light, such as light in the blue region of the visible spectrum.

According to an embodiment, a first device comprising a first organic light emitting device is also provided. The first organic light emitting device can include an anode, a cathode, and an organic layer, disposed between the anode and the cathode. The organic layer can include a first dopant having a dissociative first energy level at which doubly excited excitons and/or polarons undergo a dissociative reaction, and a second dopant having a solid state sink energy level that is lower than the dissociative energy level. The first device can be a consumer product, an organic light-emitting device, and/or a lighting panel.

BRIEF DESCRIPTION OF THE DRAWINGS

FIG. 3A shows exciton-polaron, dissociation; FIG. 3B shows exciton-exciton annihilation.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
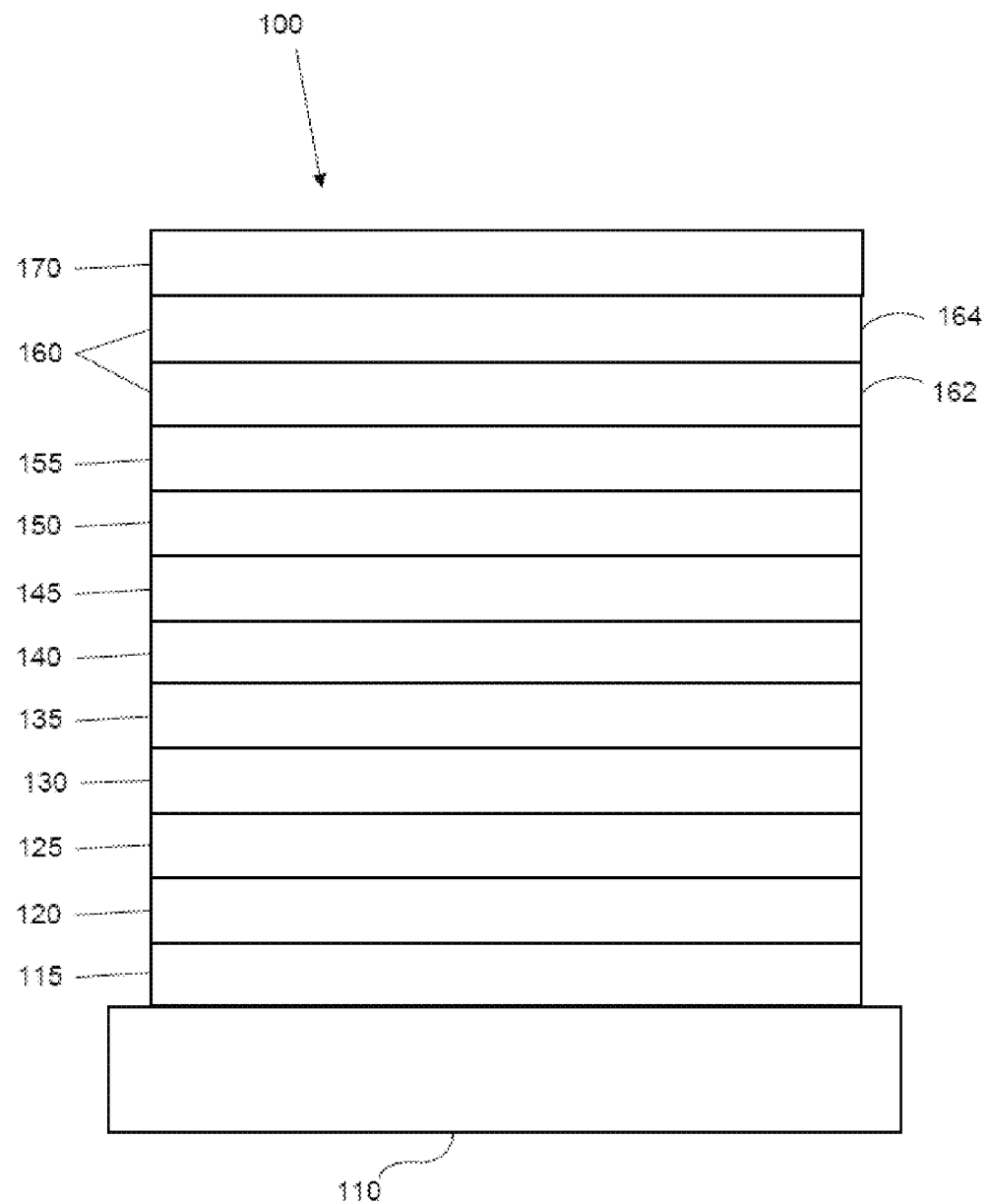
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170.

Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
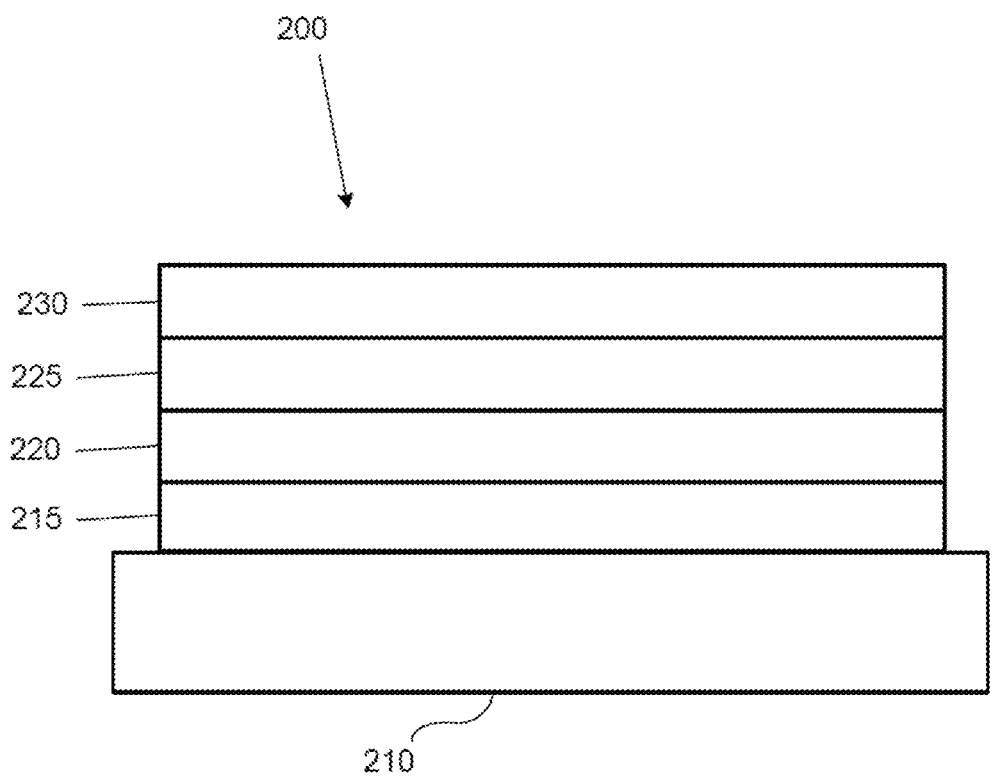
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays, 3-D displays, smart watches, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to +80 C.

Generally, different types, arrangements, and colors of OLEDs may have dramatically different operational lifetimes. For example, blue phosphorescent OLEDs (PHOLEDs) often have a relatively short operational lifetime. Blue emission comprises about 15-25% of the emission in white OLEDs (WOLEDs) depending on the WOLED color coordinates and the color temperature of the lighting. Since the blue PHOLED lifetime typically is far shorter than that of red and green, it therefore also presents the primary limitation to the WOLED lifetime.

Figure 3A:
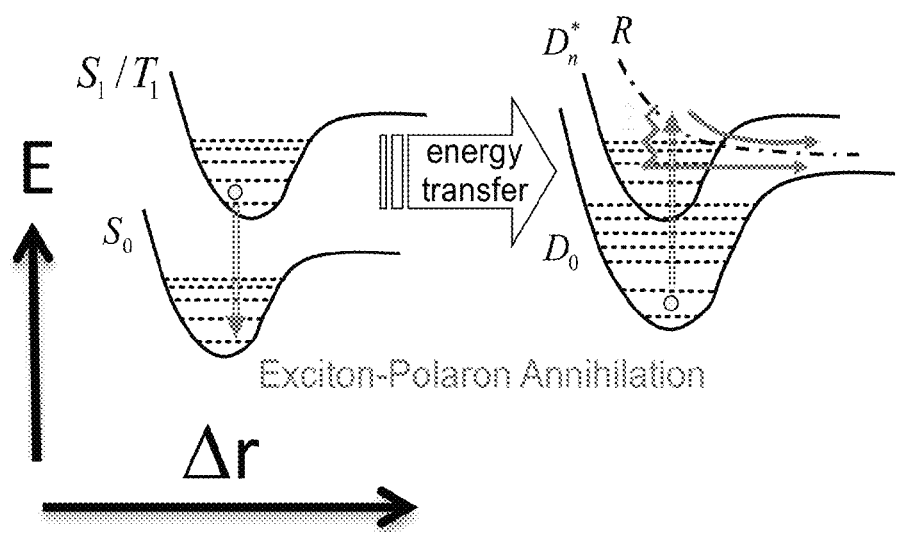
FIGS. 3A-3B show two mechanisms resulting in PHOLED failure via the dissociation of molecular species into non-emissive and permanent trap states.
Figure 3B:
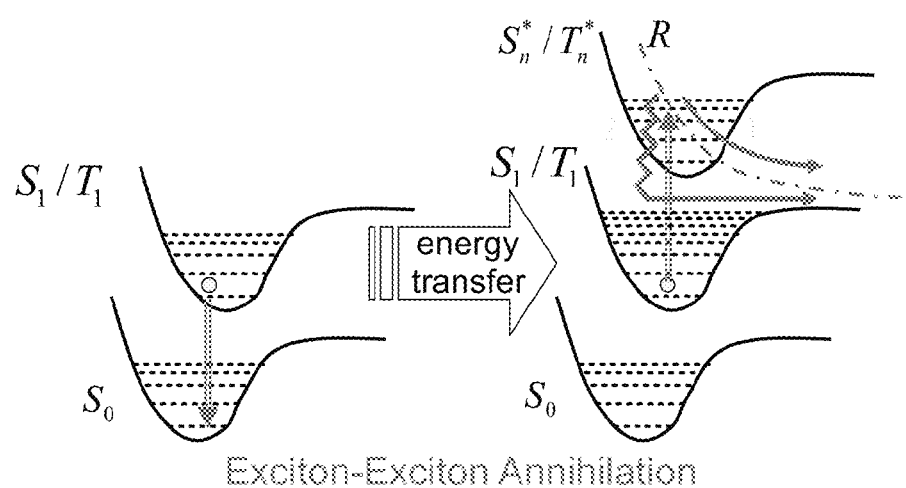

The most fundamental source of degradation in PHOLEDs is the presence of a high density of energetic molecular excited states, or excitons, which may dissipate their energy by breaking molecular bonds, thereby destroying the active electronic molecular species and at the same time forming a non-radiative defect. Particularly, excitons on the phosphor can encounter free electrons (i.e. "electron-polarons") or excitons on the host molecules, resulting in an instantaneous doubling of the polaron (or exciton) energy as shown, for example, in FIGS. 3A-3B. FIGS. 3A-3B show two mechanisms resulting in PHOLED failure via the dissociation of molecular species into non-emissive and permanent trap states, R (dashed line)— exciton polaron, i.e. charge, as shown in FIG. 3A, and exciton-exciton annihilation, as shown in FIG. 3B. Solid lines correspond to the molecular ground (S0) and excited states (singlet S0, triplet T1). Horizontal dashed lines represent the molecular vibronic energies. Here, $\Delta r$ represents the average of atomic distances within the molecule, and E the energy. The lowest $E(\Delta r)$ corresponds to the equilibrium state.

If concentrated onto a single molecular bond on the host, the excess energy can lead to molecular decomposition, or fragmentation, creating the non-radiative trap. This is a fundamental energy-driven process. It is expected the highest energy (blue) excitons lead to the highest energy polarons with the greatest probability for breaking bonds. This is precisely what is observed: blue PHOLEDs typically have orders of magnitude shorter lifetimes compared with green and red. This ultimately determines the lifetime of white PHOLEDs that may need to emit approximately 25% of their light in the blue to generate certain types of white color.

Figure 4:
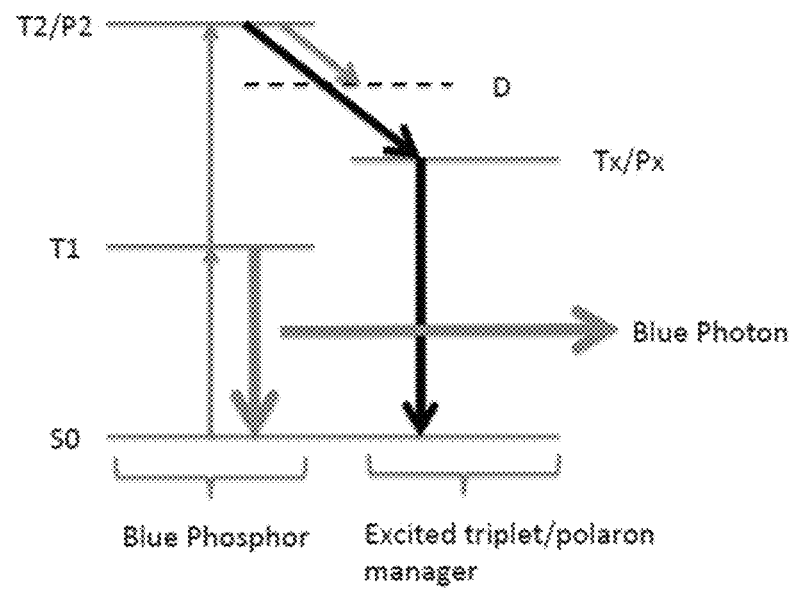
FIG. 4 shows an example energy level arrangement including a solid state sink energy level as disclosed herein.

According to embodiments disclosed herein, the effects of doubly excited triplets may be mitigated by "sinking" them with a manager material. The manager material provides a "solid state sink" energy level, to which the doubly excited triplets or polarons may transition instead of transitioning to the dissociative energy level. As further disclosed herein, this concept may be implemented by doping a blue PHOLED guest/host system with a second dopant, which removes doubly excited triplets and/or polarons from the system by drawing them to ground state. FIG. 4 shows an example energy level arrangement that may be used to "sink" the highly excited states before they result dissociative reactions with the host or phosphor dopant, using such a solid state sink energy level. In FIG. 4, the desired outcome for light emission is a transition from the T1 to the S0 state in the blue phosphor. However, this transition competes with triplet-triplet (TTQ) and triplet-polaron (TPQ) annihilation that can promote the exciton to a higher state T2/P2. This higher excitation can result in a destructive chemical reaction (TTQ or TPQ). According to embodiments disclosed herein, when the EML is codoped with an excited sink dopant, this reaction then competes with the non-dissociative transition, which returns the molecule from Tx/Px to T1, or to S0 in the manager molecule.

In such an arrangement, the rate of transition to the manager excited state or LUMO Tx/Px should be higher than the rate to the dissociative state D at which damaging TPQ and TTQ may occur. Thus, to effectively manage the multiply excited triplets, both the energetic and spatial properties of the system should favor the transition from T2/P2 to Tx/Px over the transition to D. This suggests that the energy of the Tx/Px state should be lower than the D state. Alternatively or in addition, it may suggest that the manager molecules should be positioned relatively close to the phosphor through a high doping concentration to allow for rapid energy and/or charge transfer. As previously described, the rate of transition of doubly excited excitons and/or polarons from to the solid state sink energy level may be higher than the rate of transition to the dissociative energy level. The relative efficacy of "sinking" need not be perfect, as removing only a fraction of the double excited states can have a significant effect on the PHOLED lifetime. For example, it has been shown that about only 1 in 1000 excitations leads to molecular dissociation that then forms a non-radiative recombination center. Appropriate molecules for the "manager" material include UV absorbers such as 1,4,5,8-Naphthalenetetracarboxylic dianhydride (NTCDA).

More specifically, according to an embodiment disclosed herein, an organic emissive layer such as a blue emissive layer in a PHOLED or other OLED may include a host material that is doped with at least two dopants. The first dopant, typically the emissive dopant, has a dissociative energy level at which doubly excited excitons and/or polarons undergo a dissociative reaction as previously described, which may cause damage to the host molecule. In general, the most damaging reaction is when an exciton on the dopant and a polaron on the host undergo triplet-polaron quenching, which typically will cause damage to the host. The first dopant also may have an emissive first triplet energy level T1 that is lower than the solid state sink energy level of the second dopant, as shown in FIG. 4. As described in further detail below, the first dopant also may be one that is selected to provide thermally assisted delayed fluorescence. More generally, the first dopant may be a phosphorescent or a fluorescent dopant. The dopant may be one that emits light of any color, though it is expected that the benefits described herein will be particularly suited to blue-emitting materials.

In some embodiments, the manager material, i.e., a second dopant, may have a solid state sink energy level that is between the singly—excited triplet or polaron energy level of the emissive material and a multiply-excited triplet or polaron energy level of the emissive material, typically a doubly-excited triplet or polaron energy level. For example, referring to FIG. 4, the Tx/Px energy level of the manager is between the T1 and T2/P2 energy levels of the emissive material. Such an arrangement may provide the benefits disclosed herein even where the sink energy level Tx/Px is not substantially lower than, equal to, or slightly higher than the dissociative energy level D, because competing rates of transition to the two levels may reduce degradation in the host and/or emissive materials, as disclosed herein. In general, it may be preferred for the solid state sink energy level to be at least 0.2 eV below the multiply-excited triplet or polaron energy level of the emissive material, to prevent transfers back to the multiply-excited state. For example, referring to FIG. 4, it may be preferred for the solid state sink energy level Tx/Px to be at least 0.2 eV lower than the doubly-excited triplet or polaron energy level T2/P2.

In the annihilation process in FIG. 3, an exciton and polaron combine to generate "hot" states via:

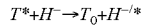

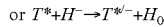

where "*" indicates a multiply excited state, "−" a polaron on the corresponding molecule, and host ($H^{-/*}$) or phosphor ($T^{-/*}$) represent a hot polaron or hot triplet on the host or phosphor, respectively. It may not be possible to quantify this reaction directly, since the amount of degraded material in the thin film typically is too low to be analytically measured. The hot polaron states may be quantized similarly to the techniques described in I. Ghosh et al., Science 346, 725-728 (2014), in which where a reduced organic compound in solution was photolyzed to generate the equivalent hot state. This state can reduce chloro-aromatic compounds, ultimately producing halide ions and aryl radicals. A similar approach may be used in which solutions of $T^-$ and $H^-$ ions are irradiated while monitoring their photostability to determine whether a hot polaron on the phosphor or host is the "weak link" in a given phosphor-host pair. The excited state lifetimes of $H^{-/*}$ and $T^{*/-}$ may be characterized using transient absorption (TA) spectroscopy, and the hot polaron lifetime correlated with its photostability. In addition, high performance liquid chromatography, mass spectroscopy and Fourier transform infrared spectroscopy may be used to identify the decomposition products. With this information, "hardened" materials may be designed that are less susceptible to fragmentation in the $H^{-/*}$ or $T^{*/-}$ state, further decreasing the likelihood of destructive decay from the hot polaron.

Figure 5A:
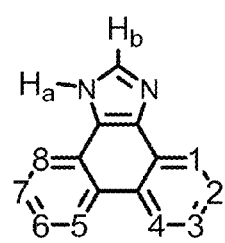
FIG. 5A shows a structure suitable to measure aza-substitution in an H3P material.
Figure 5B:
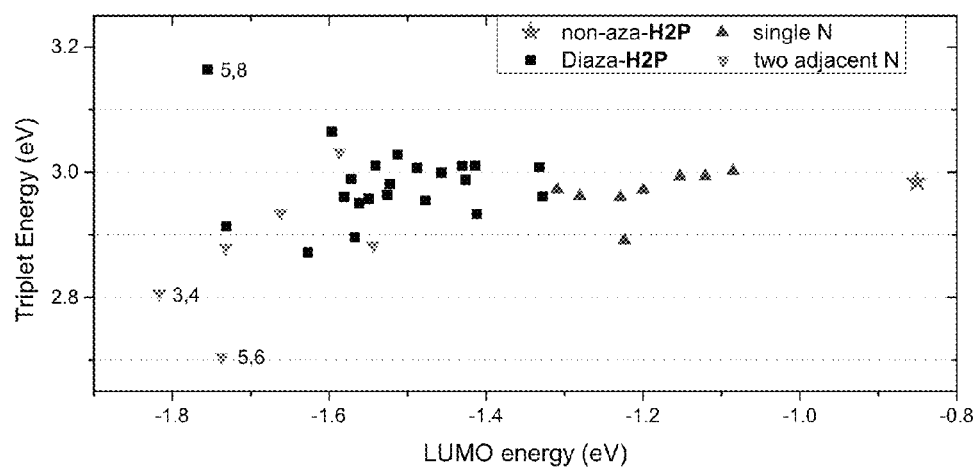
FIG. 5B shows features of the compounds resulting from the structure in FIG. 5A.

A similar approach may be used to estimate the energy of $H^{-/*}$ or $T^{-/*}$ by examining the photostability of $H^-$ and $T^-$ in the presence of a range of trapping agents. By using trapping agents with graded reduction potentials the reducing power of the hot polaron may be estimated. This estimate then allows for a selection of appropriate candidates from libraries of H3 and H2P materials, for example as shown in FIG. 5, to quench the hot polaron, while not trapping charge or triplets. FIG. 5A shows a structure suitable to measure aza-substitution in an H3P material; the variation provides 37 different compounds, as shown in FIG. 5B. Other materials also may be used as triplet-triplet and triplet-polaron quenchers, such as pyridyl, pyrazine and triazine based materials which are reducible, stable, and have high triplet energies.

The described approach is focused on the anionic host and dopant. This is because in most cases the phosphor dopant traps and transports holes, while electrons are transported by the host matrix. Hence, the electron density in the EML tends to significantly exceed that of higher mobility holes. Nevertheless, the methodology can be used equally well to study the stability of cathodic $H^{+/*}$ and $T^{+/*}$ states if the primary carrier in the host is the hole.

As previously described, the model illustrated in FIG. 3 suggests that PHOLED operational lifetimes can be greatly extended by reducing triplet-polaron quenching (TPQ) and triplet-triplet quenching (TTQ) annihilation events that lead to molecular destruction. Even removing only a small fraction of the highly excited states may have a remarkable effect on PHOLED lifetime since there is a probably of only 1 in $2\times10^{-9}$ that an excitation will lead to molecular dissociation. Thus, alternatively or in addition to using a manager material having a solid state sink energy level as previously described, in embodiments disclosed herein, the rate of TPQ and TTQ may be reduced through extending the device emission zone via phosphor dopant grading across the PHOLED emissive layer. That is, the concentration of a dopant within a host-dopant system as previously described with respect to FIG. 4 may be graded within the host material. Such a configuration may provide up to a tenfold improvement in blue PHOLED operational lifetime relative to conventional designs. Strategic grading reduced the exciton and polaron densities (and hence their tendency to create traps through energetic encounters) while also increasing efficiency at high brightness by reducing triplet annihlation. This approach has been found to triple the lifetime of a relatively stable blue emitting phosphor from $LT_{80}$=50 hrs at an initial luminance of $L_0$=1000 cd/m$^2$. When used in a stacked structure, a lifetime of $LT_{80}$>600 hr may be achieved. In this example, the phosphor Ir(dmp)3, a hole conductor, is paired with a stable, electron conducting host, such as mCBP. Ordinarily, the doping of the PHOLED EML is uniform, in which case almost all excitons form at the EML/electron transport layer (ETL) interface, resulting in the local pile-up of a high density of electrons and excitons where TPQ and TTQ is frequent. To lower local exciton and polaron densities, the phosphor concentration may be graded from, for example, about 20% at the hole transport layer (HTL)/EML interface, to about 8% at the opposite EML/ETL interface. For example, an emissive layer as described with respect to FIGS. 1-2 may be graded between two adjacent layers, such that the concentration of a phosphorescent or other emissive dopant in the emissive layer is graded vertically across the emissive layer. Such a structure has been found to increase the lifetime of a blue PHOLED by a factor of up to 10 when used in a stacked blue PHOLED.

Different grading profiles from those used to optimize simple guest-host doped EMLs may be used, since the presence of the sink molecule may change the exciton and charge distributions. It is anticipated that the combination of graded doping and the use of excited state sinks can increase the lifetime of blue PHOLEDs by a factor of 1000 or more, compared to current conventional devices. This approach is general, and hence can also be applied to red and green phosphorescent devices as well as blue devices as disclosed herein. Hence, excited state sinking may result in phosphor lifetimes exceeding 1 million hours in some cases.

Excited state management as disclosed herein also may be used in devices and arrangements that make use of phosphor sensitized fluorescence and/or thermally activated delayed fluorescence (TADF). Both techniques typically require sensitizers having energies higher than the emissive energy, especially "hyperfluorescence" in which a TADF sensitizer transfers energy to a blue fluorophore. In both cases, EML grading and/or excited state management as disclosed herein may provide improved lifetimes of the devices. For example, the first or primary dopant in a guest/host emissive layer as disclosed herein may be a dopant suitable for use with TADF, in which excitons are maintained in the triplet manifold of the dopant. A UV sensitizer is then used to access the fluorescence dopant energies. However, the longer triplets are maintained at a relatively high energy, the higher the chance that they collide with a triplet or polaron from another molecule and undergo a destructive transition as previously described. The excited state management techniques disclosed herein may prevent such destructive transitions, thereby improving the lifetime of the TADF or similar system.

Techniques disclosed herein may be suitable for use in any arrangement or device that includes organic emissive layers, such as OLEDs, white-emitting OLEDs (WOLEDs), and the like. Similarly, any device that can incorporate an OLED as disclosed herein, also may incorporate OLEDs having emissive layers as disclosed herein.

Layers, arrangements, and techniques as disclosed herein may be used with any device that uses organic emissive layers, such as the OLEDs described with respect to FIGS. 1-2. For example, one or more emissive layers in an OLED, such as emissive layers 135, 220, may be doped with first and second dopants as disclosed herein to provide a solid state sink energy level within the emissive layer as previously described. Such a device may be a pixel or sub-pixel in a device such as a full-color display, or any other device that incorporates structures such as shown in FIGS. 1-2 and disclosed herein. It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. An organic emissive layer comprising:
   a host material;
   a first dopant having a dissociative first energy level at which doubly excited excitons and/or polarons undergo a dissociative reaction, wherein the first dopant includes a fluorescent dopant that provides thermally assisted delayed fluorescence in the host material; and
   a second dopant having a solid state sink energy level that is between a singly-excited energy level of the first dopant and a multiply-excited energy level of the first dopant.

2. The emissive layer of claim 1, wherein the solid state sink energy level is lower than the dissociative first energy level of the first dopant.

3. The emissive layer of claim 1, wherein the multiply-excited energy level of the first dopant is a doubly-excited triplet energy level.

4. The emissive layer of claim 1, wherein the multiply-excited energy level of the first dopant is a doubly-excited polaron energy level.

5. The emissive layer of claim 1, wherein the first dopant has an emissive first triplet energy level that is lower than the solid state sink energy level of the second dopant.

6. The emissive layer of claim 1, wherein the solid state sink energy level is at least 0.2 eV below the multiply excited energy level.

7. The emissive layer of claim 1, wherein the concentration of the first dopant is graded within the host material.

8. The emissive layer of claim 1, wherein the rate of transition of the excitons and/or polarons from a doubly-excited triplet energy level of the first dopant to the solid state sink energy level of the second dopant is higher than the rate of transition from the double-excited triplet energy level of the first dopant to the dissociative energy level.

9. The emissive layer of claim 1, wherein the second dopant absorbs light in the ultraviolet region of the electromagnetic spectrum.

10. The emissive layer of claim 9, wherein the second dopant comprises 1,4,5,8-Naphthalenetetracarboxylic dianhydride (NTCDA).

11. An organic light emitting device (OLED) comprising the emissive layer of claim 1.

12. The OLED of claim 11, wherein the device comprises a white-emitting OLED (WOLED), and wherein the emissive layer emits light in the blue region of the visible spectrum.

13. The OLED of claim 11, wherein the device is selected from the group consisting of: a flat panel display, a computer monitor, a medical monitor, a television, a billboard, a light for interior or exterior illumination and/or signaling, a heads-up display, a fully or partially transparent display, a flexible display, a laser printer, a telephone, a cell phone, a tablet, a phablet, a personal digital assistant (PDA), a laptop computer, a digital camera, a camcorder, a viewfinder, a micro-display, a 3-D display, a smart watch, a vehicle, a large area wall, theater or stadium screen, and a sign.

14. An organic emissive layer comprising:
   a host material;
   a first dopant having a dissociative first energy level at which doubly excited excitons and/or polarons undergo a dissociative reaction, wherein the first dopant includes 1,4,5,8-Naphthalenetetracarboxylic dianhydride (NTCDA); and a second dopant having a solid state sink energy level that is between a singly-excited energy level of the first dopant and a multiply-excited energy level of the first dopant.

15. The emissive layer of claim 14, wherein the solid state sink energy level is lower than the dissociative first energy level of the first dopant.

16. The emissive layer of claim 14, wherein the multiply-excited energy level of the first dopant is a doubly-excited triplet energy level, or a doubly-excited polaron energy level.

17. The emissive layer of claim 16, wherein the NTCDA has an emissive first triplet energy level that is lower than the solid state sink energy level of the second dopant.

* * * * *